United States Patent
Vibet et al.

(10) Patent No.: US 6,798,496 B2
(45) Date of Patent: Sep. 28, 2004

(54) DEVICE FOR EXPOSING A FACE OF A PANEL

(75) Inventors: Gilles Vibet, Le Petit Quevilly (FR); Manuel Cuevas, Rouen (FR)

(73) Assignee: Automa_Tech, Val de Reuil (FR)

( * ) Notice: Subject to any disclaimer, the term of this patent is extended or adjusted under 35 U.S.C. 154(b) by 0 days.

(21) Appl. No.: 10/284,573

(22) Filed: Oct. 30, 2002

(65) Prior Publication Data

US 2003/0081195 A1 May 1, 2003

(30) Foreign Application Priority Data

Oct. 31, 2001 (FR) .............................................. 01 14114

(51) Int. Cl.$^7$ .......................... G03B 27/54; G03B 27/52
(52) U.S. Cl. .......................................... 355/71; 355/30
(58) Field of Search .............................. 355/30, 53, 67, 355/69, 71, 77

(56) References Cited

U.S. PATENT DOCUMENTS

| | | | |
|---|---|---|---|
| 5,001,038 A | | 3/1991 | Dorinski et al. |
| 5,194,893 A | * | 3/1993 | Nishi ........................... 355/53 |
| 5,473,410 A | * | 12/1995 | Nishi ........................... 355/53 |
| 5,663,784 A | * | 9/1997 | Tanimoto ..................... 355/68 |
| 6,213,607 B1 | * | 4/2001 | Watanabe et al. ........... 359/601 |
| 6,369,876 B1 | * | 4/2002 | Sato ............................. 355/69 |

FOREIGN PATENT DOCUMENTS

| | | |
|---|---|---|
| EP | 0 420 526 A2 | 4/1991 |
| GB | 2 101 755 A | 1/1983 |

* cited by examiner

*Primary Examiner*—Alan Mathews
(74) *Attorney, Agent, or Firm*—James Ray & Associates

(57) ABSTRACT

The invention provides apparatus for exposing a face of a panel, in particular a printed circuit panel, the device including a light source. The device further comprising:

- two moving shutters suitable for masking said light source, each of said shutters presenting a respective edge, said edges together defining a window through which a light zone is generated on said face of the panel to be exposed;
- means for displacing said shutters in a plane lying between said light source and said panel; and
- control means for controlling the displacement of said shutters in such a manner that both shutters move past said face of the panel at substantially the same speed and in the same direction.

20 Claims, 6 Drawing Sheets

DEVICE FOR EXPOSING A FACE OF A PANEL

The present invention relates to a device for exposing at least one face of a panel, in particular a printed circuit panel, the device comprising a light source and means for holding said panel facing said light source.

BACKGROUND OF THE INVENTION

Such devices serve in particular to make printed circuits from a panel coated in photosensitive material with artwork being put in front of the panel, said artwork carrying tracks to be generated on the printed circuit. A light beam then serves to expose the entire panel either by scanning successively over said surface or else by globally exposing the surface as a whole.

The photosensitive material which generally comprises a dry film or ink needs to receive a precise quantity of light energy that is constant over its entire area in order to ensure good polymerization of the photosensitive material, thereby guaranteeing the final quality of the printed circuit. When the material is underexposed, subsequent development takes place poorly, and in particular the polymerization of the photosensitive material is irregular, often leading to tracks on the printed circuit that are too fine or even that are interrupted; in the opposite case of overexposure, the fidelity with which the image is reproduced is degraded, in particular by the tracks becoming wider than the desired width, which can lead to certain tracks touching one another, thereby leading to short circuits.

In order to improve productivity, in particular by reducing the total time required for exposing panels, use is being made of ever-brighter light sources and of photosensitive materials that are more and more sensitive. Nevertheless, such light sources can be modulated to a small extent only, which makes it necessary to be able to adapt panel exposure time over periods that are becoming shorter and shorter.

Furthermore, switching off the light source requires a pause that is long, possibly has long as 30 minutes, before it is possible to switch the light source back on again, so switching off and on is preferably avoided in order to optimize productivity of the exposure device. Thus, provision is generally made to leave the light source on continuously and to use a shutter which alternately shuts off and reveals the light source by moving between the light source and the face to be exposed.

Such devices with a shutter serving alternately to mask and to uncover the light source are known, thus making it possible to leave the light source on continuously.

Furthermore, the large extent of sensitivity ranges for photosensitive materials, which can go from less than 10 $mJ.cm^{-2}$ to more than 600 $mJ.cm^{-2}$, requires that it be possible to modulate exposure time very considerably.

Nevertheless, those devices having a single shutter do not enable short exposure times to be obtained with shutter displacement having a level of accuracy that is sufficient and repeatable.

In addition, the light source can be masked either by moving the single shutter in a plane, or by moving it circularly around the light source.

In the first case, the plane shutter generally performs a go-and-return stroke past the light source, and the zone of the panel that is exposed first ends up by being exposed for longer since it is also the zone to be masked last, which means that exposure is not uniform over the entire surface.

In the second case, the shutter is generally rotary and requires a rotary drive mechanism that can make it possible to obtain both speeds of rotation that are high and stopping times that are short. Such a mechanism enables the panel to be exposed in uniform manner and enables exposure times to be adapted. Nevertheless, it is necessary to increase the speed of rotation of the shutter quite considerably in order to obtain exposure times that are very short, particularly when they are shorter than one second, and that leads to technical difficulties in implementation. The dynamic stresses due to the inertia of the drive system and to the drive forces to which the device is subjected increase with increasing speed of rotation. Consequently, for short exposure durations, the device does not enable satisfactory repeatability to be guaranteed between two exposures, whether in terms of rotation speeds or in terms of the precision with which the shutter can be stopped.

OBJECT AND SUMMARY OF THE INVENTION

The object of the present invention is to provide a device enabling panel exposure to be improved, in particular when the panel is covered in a material that is very sensitive, which device enables a very wide range of exposure durations to be implemented thus enabling the same device to be used to expose materials of different sensitivities.

This object is achieved because of the fact that the device comprises:

- first and second moving shutters suitable for acting in succession to mask said light source at least in part, each of said shutters presenting a respective edge, said edges together defining a window suitable for being adjusted and through which a light zone is generated on said face of the panel to be exposed;
- displacement means for displacing said shutters to displace said shutters in a plane disposed between said light source and said panel; and
- displacement control means for controlling the displacement of said shutters as a function of the sensitivity of the face to be exposed and as a function of the power of said light source, in such a manner that both shutters move past said face of the panel at substantially the same speed and in the same direction.

Since high power light sources operate at fixed power values that are difficult to modulate, energy levels are varied by means of different exposure durations.

Having two shutters makes it possible to begin and end exposure in the same zone of the panel. By moving the shutters in the same direction and at the same speed, exposure uniformity is guaranteed over the entire face, even when exposure time is very short. Similarly, when scanning is used, since each zone corresponds to the area of the window, each zone is subjected to the same quantity of energy, given that, for example, the zone of the face which is exposed first is also the zone to be masked first.

For materials that are very sensitive, requiring exposure times that are very short, of the order of a few tenths of a second, it is preferable to select a window of size that is smaller than the size of the panel face to be exposed, so as to scan over the entire face by moving the window past the fixed panel.

Conversely, with materials that are less sensitive, where longer exposure times may be as long as several tens of seconds, the window is opened to the maximum and exposure is performed globally over the entire face of the panel.

The displacement speed of each shutter is preferably constant throughout its displacement past the panel to be exposed, but in order to optimize production times, displacement speed may vary depending on the nature of the displacement.

It will be understood that while opening the exposure window, i.e. until the first shutter has reached a distance from the second shutter that corresponds to the desired window size, the displacement speed of the first shutter may be higher than its speed during exposure itself. It follows that during exposure, the speed of the second shutter (identical to the displacement speed of the first shutter during opening) is also greater than the speed of the second shutter during exposure.

Similarly, the panel may have discontinuous exposure zones between which the two shutters may be displaced at a speed that is higher than their speed during exposure.

The speeds of the shutters may vary while a panel is being processed (before, during, and after exposure) providing the speed of each of the two shutters is substantially equal to the speed of the other shutter for each operation of the same kind (opening/closing the window, exposure, etc.).

Advantageously, the displacement means may enable the displacement speed of each of the shutters to be adjusted or modulated throughout their displacement.

Advantageously, the displacement means comprise first displacement means for said first shutter and second displacement means for the second shutter.

Thus, each shutter is advantageously connected to displacement means that are specific thereto so as to make it possible to displace one shutter independently of the other. Two embodiments can thus be envisaged. In the first, the shutters are different from each other and they are driven together in displacement, while in the second embodiment, the two shutters are identical and they are driven individually by displacement means that are preferably identical, but specific to each shutter.

In order to be able to drive the shutters quickly and exactly past the face of the panel to be exposed, the displacement means are accurate means, preferably linear means so as to be able to guarantee a constant displacement speed for the shutter all along its travel past the panel to be exposed.

Advantageously, the displacement means comprise an actuator, preferably a rodless pneumatic actuator.

Any other displacement means enabling the displacement speeds of the shutters to be modulated or adjusted in a manner that is precise, reliable, and repeatable, can be envisaged, for example a linear motor.

Advantageously, the displacement control means include first displacement initialization means for initializing displacement of said first shutter and second displacement initialization means for initializing displacement of said second shutter, said first and second displacement initialization means being independent of each other and enabling the size of the window to be adjusted.

Advantageously, the control means enable the displacement speeds of the shutters to be controlled and adjusted throughout displacement thereof by acting on the displacement means at all times throughout panel processing.

Adjusting window size makes it possible to modulate the quantity of energy received by the photosensitive materials without it being necessary to act specifically on the displacement speed of the two shutters. Thus, each time the sensitivity of the photosensitive material is changed, and possibly also each time the power of the light source is changed, it suffices to adjust window size in order to obtain a desired quantity of energy. This adjustment is performed merely by modifying the displacement parameters of the two shutters, so a single exposure device can be used for making printed circuits from any type of photosensitive material.

For the second embodiment envisaged above, each shutter possesses its own displacement initialization means. For the first embodiment, its first variant in which the window is opened in front of the panel face to be exposed is comparable to the second embodiment in that it requires each shutter to have its own initialization means. However, it has a second variant, in which the first shutter is positioned relative to the second shutter prior to exposure, with both shutters being displaced simultaneously throughout exposure, so the initialization means can be common and constituted solely by initializing the second shutter.

Advantageously, the first displacement means are disposed on said second shutter such that said first shutter is suitable for moving relative to said second shutter.

Thus, in the first embodiment, a first shutter is fixed to the second shutter which carries the first shutter with it. In this case, the first shutter presents a solid surface acting as a mask which is placed in front of the second which also has a solid surface, but with a large open area in front of which the first shutter is placed.

The offset in the positioning of the first shutter on the second determines the area of the window. The displacement speed of the first shutter relative to the second is of little importance, particularly since the window remains open away from the exposure zone prior to displacement of the second shutter, and can therefore be implemented using any known means, whether the means are mechanical, pneumatic, or other. The means for displacing the first shutter relative to the second should nevertheless be selected in such a manner as to enable positioning to be accurate and reproducible so as to guarantee that the area of the window can be properly adjusted.

Advantageously, the device further includes a device for cooling the light source.

Since the light source is of high power, e.g. up to about 10 kilowatts (kW) for a mercury vapor discharge lamp, it is desirable to cool it, e.g. by circulating cold air so as to dissipate as much heat as possible and avoid raising the temperature of the exposure device as a whole, given that in the vicinity of the light source, temperatures may be higher than 1000° C.

When the shutter is placed in front of the light source, in particular in the closed position, it receives all of the light intensity from the source. Thus, in order to avoid heat damage to the shutter and its surroundings (displacement means, control means, etc.), each shutter advantageously comprises refractory material.

Thus, even when the shutter is in the closed position, remaining in front of the light source while it is left on permanently, the shutter is capable of accumulating a large quantity of heat without damage.

In addition, in order to preserve the shutters, it is preferable for them to reflect light rays back to the light source as much as possible. Thus, each shutter advantageously presents a reflecting surface enabling it to return at least a fraction of the light emitted by the light source. Since the light source is preferably cooled, it is capable of disposing of the heat reflected by the shutter.

BRIEF DESCRIPTION OF THE DRAWINGS

The invention will be well understood and its advantages will appear better on reading the following detailed description of embodiments given as non-limiting examples.

The description refers to the accompanying drawings, in which.

MORE DETAILED DESCRIPTION

Figure 1:
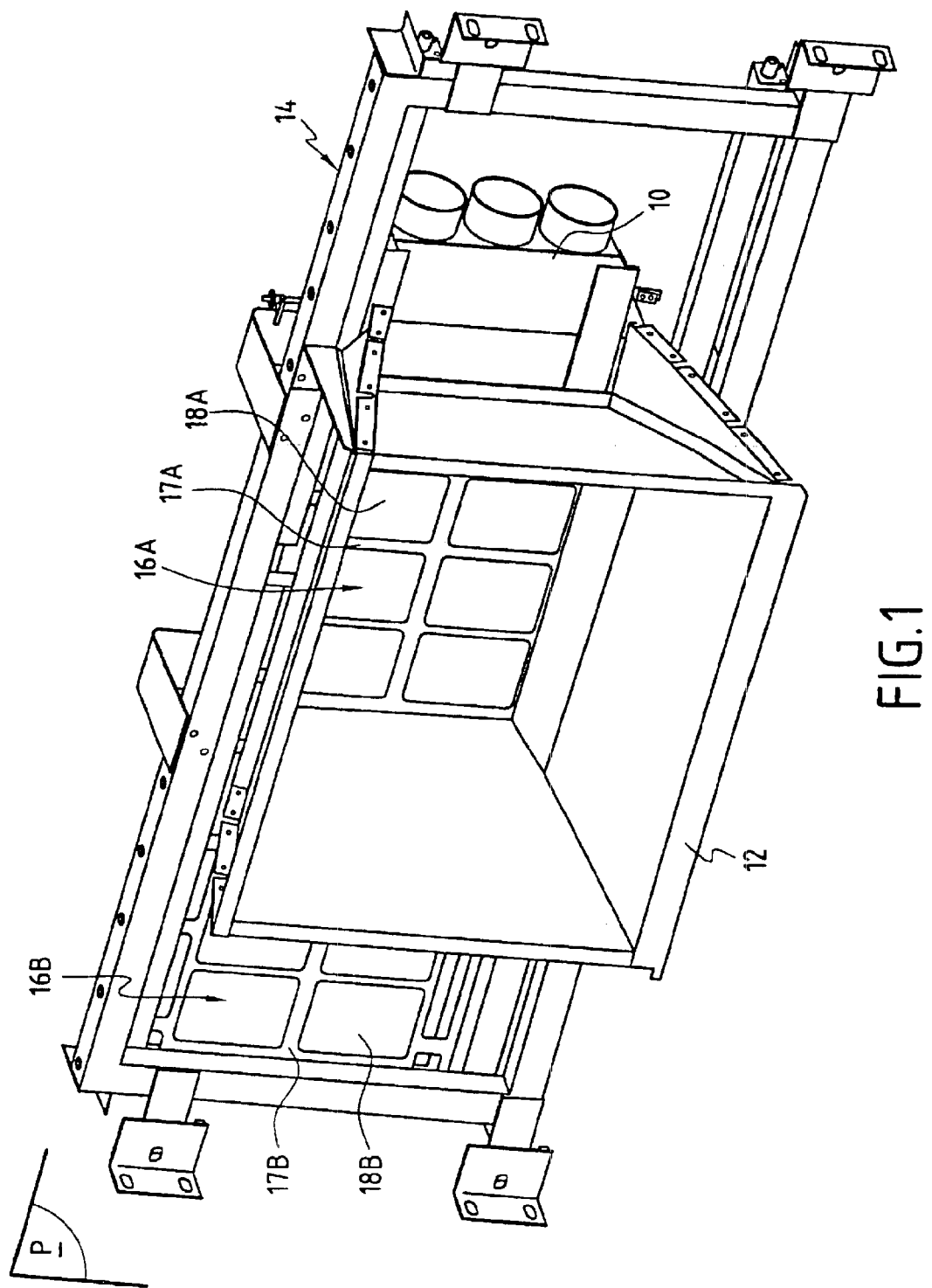
FIG. 1 is a perspective view of the front of the exposure device of the invention.

The exposure device of the invention shown in FIG. 1 comprises a light box assembly 10 and a reflector assembly 12 for collimating and distributing the light emitted by the light box assembly 10 in uniform manner. The light box assembly 10 and the reflector assembly 12 are both placed on a frame 14 fixed to the main structure (not shown) of the exposure device.

Two shutters 16A and 16B are suitable for moving between the light box assembly 10 and the reflector assembly 12 so as to mask and/or uncover the light box assembly 10, depending on the respective positions of the shutters. In FIG. 1, the first shutter 16A is in the closed position, being placed in front of the light box assembly 10, while the second shutter 16B is in a waiting position on the left-hand side of the device. In this configuration, no light rays leave the light box assembly 10 which is closed by the first shutter 16A. The device is not making an exposure.

Preferably, each shutter 16A (16B) comprises a metal strength member of refractory material 17A (17B) covered in sheet metal 18A (18B) presenting a rear face 19A (19B) (see FIG. 2), that reflects light back into the light box 10.

Figure 2:
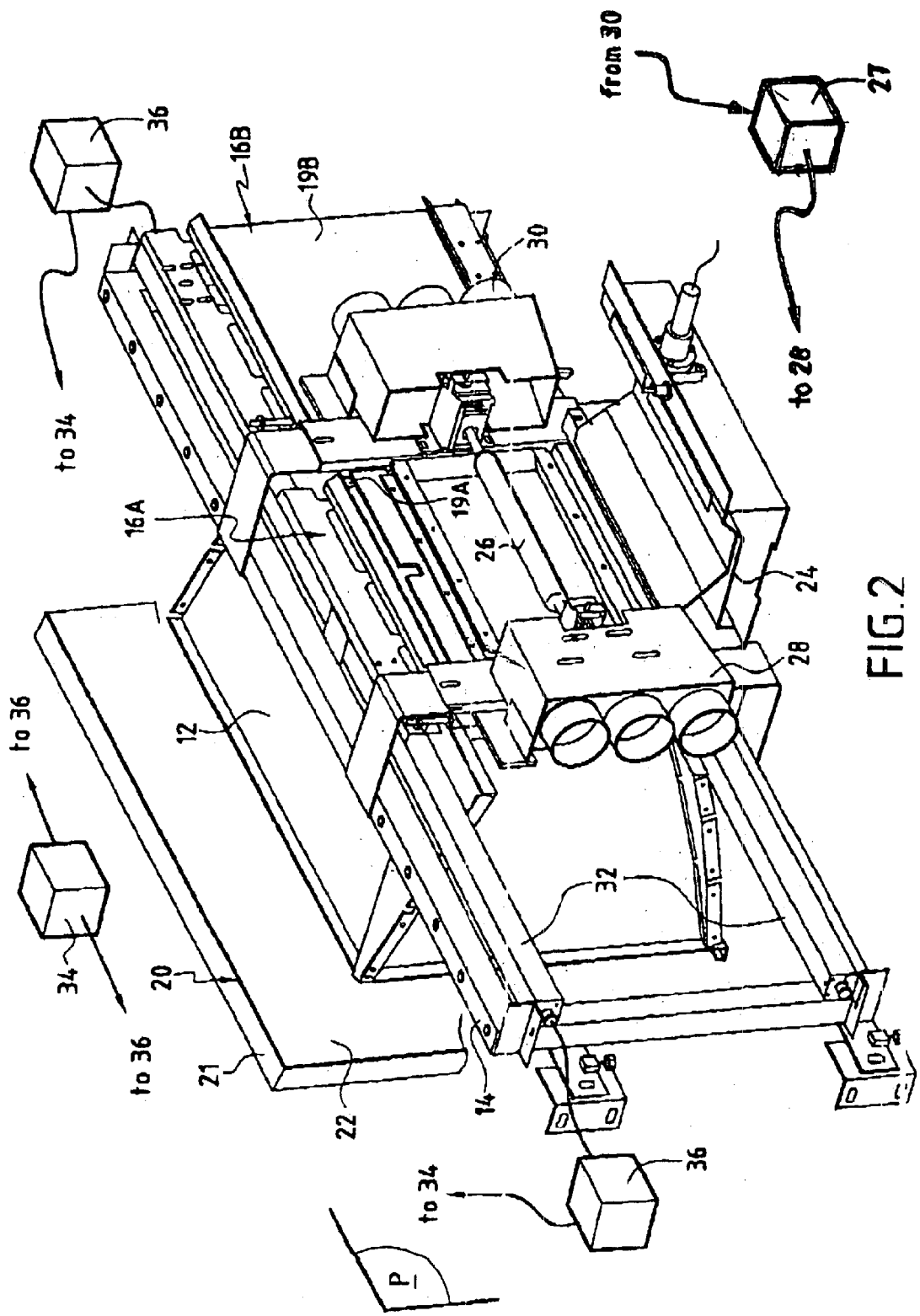
FIG. 2 is a perspective view of the back of the exposure device of the invention.

FIG. 2 shows the exposure device seen from behind, the two shutters 16A and 16B being in the same position as in FIG. 1. A panel 20 is held in front of the reflector assembly 12 by support means 21 such as a frame co-operating with the main structure of the device and suitable for putting the face 22 of the panel 20 in register with the light box assembly 10 in front of the reflector assembly 12.

The light box assembly 10 has an additional reflector 24 forming a rear cover which can be opened, in particular in order to make it easy to change the light sources, 2.6. a single lamp 26 of tubular shape. A cooling device, e.g. air conditioning 27 serves to cool the light box assembly 10 by injecting air through the air inlet ducts 28 placed close to one side of light box assembly 10. Air outlet ducts 30 placed on the opposite side of the light box assembly 10 serve to exhaust the flow of air through the light box assembly 10 and in particular past the light source 26, thus generating a stream of air suitable for removing a large quantity of heat.

Displacement means 32 for moving the shutters 16A and 16B co-operate with the frame 14 in such a manner as to enable the shutters 16A and 16B to move relative to the stationary frame 14, thereby causing the shutters 16A and 16B to move relative to the light box assembly 10 in a plane P that is substantially parallel to the panel 20.

Displacement control means 34 connected to the displacement means 32 serve to control the displacement of the shutters 16A and 16B at a common speed V, which is preferably constant throughout the stage of exposing the panel 20, which speed lies on average in the range 1 m.s$^{-1}$ to 1.5 m.s$^{-1}$; the displacement control means 34 also have initialization means 36 which trigger the start of displacement for each shutter.

The displacement means 34 can enable each of the two shutters 16A and 16B to be displaced independently at a speed $V_D$ which may be variable, e.g. greater than V, during each of two respective phases of opening/closing the exposure window.

In addition, for particular implementation reasons, it can be preferable for the displacement speed of the shutters 16A and 16B also to be variable during the exposure stage.

Whatever the stage in question (opening/closing the window, exposure, etc.), it is necessary for each of the two shutters 16A and 16B to have the same speed, not at the same time but at the same geometrical points through which they pass respectively, and for this to apply to all identical points, it being naturally possible for the speeds of the two shutters 16A and 16B to vary over time, i.e. from one geometrical point to another.

Figure 3:
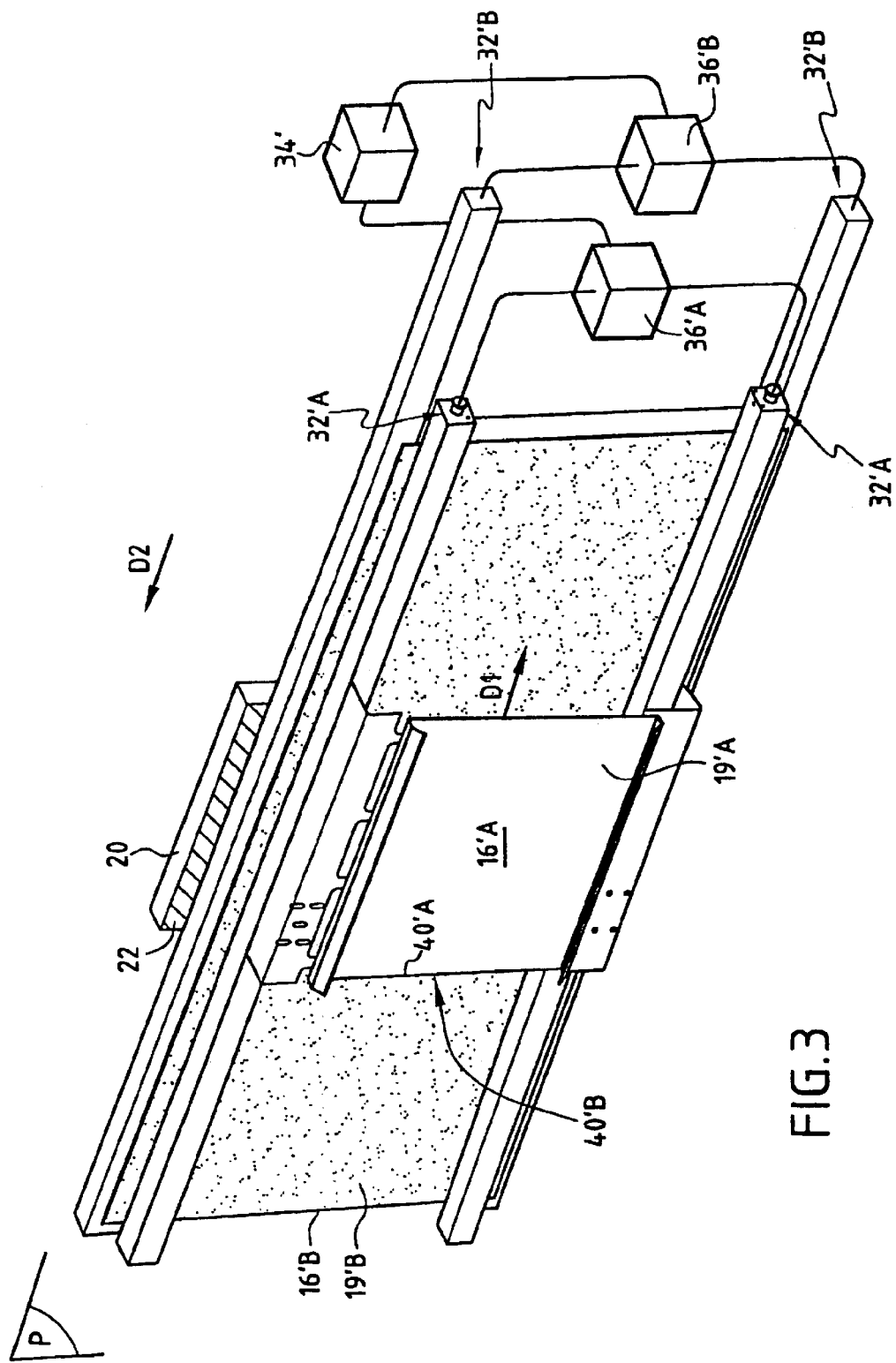
FIG. 3 is a perspective view of shutters in one embodiment, the two shutters touching each other.
Figure 4:
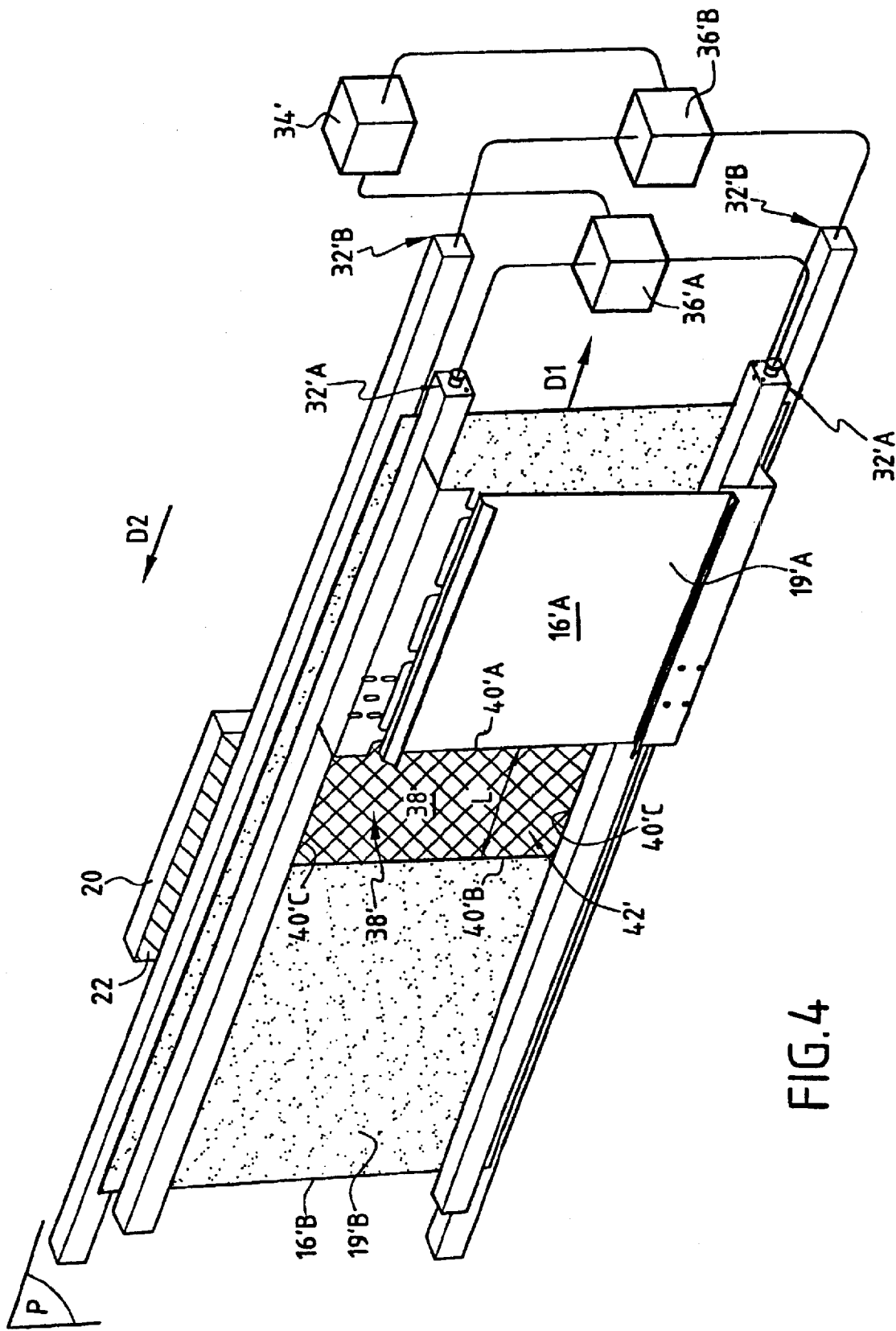
FIG. 4 is a view analogous to FIG. 3, but with the two shutters spaced apart.

In a first embodiment shown in FIGS. 3 and 4, the shutters slide relative to each other. A first shutter, e.g. 16'A co-operates with a second shutter 16'B via first displacement means comprising a slideway 32'A, a rack or any other known means for generating movement in translation preferably being fixed on the second shutter 16'B. In this embodiment, the displacement means comprise on one hand, for the first shutter 16'A, the slideway 32'A fixed to the second shutter 16'B and actuatable by first initialization means 36'A specific thereto, and on the other hand, for the second shutter 16'B, second displacement means comprising, for example, a rodless pneumatic actuator 32'B fixed to the stationary frame 14 and over which the shutter 16'B is moved in translation in the plane P under drive from second initialization means 36'B which are specific thereto.

Control means 34' are connected to the first and second initialization means 36'A and 36'B of the respective shutters 16'A and 16'B. In FIG. 3, the two shutters 16'A and 16'B are shown in the closed position, i.e. no light rays pass from the light box assembly 10 (shown in FIGS. 1 and 2) to reach the face 22 of the panel 20 to be exposed, which face is placed facing the exposure device.

Initially, the first shutter 16'A slides in a first direction D1 contained in the plane P, over the second shutter 16'B so as to open a window 38 of size that is determined as a function of the photosensitive material and of the power of the light source 26 (shown in FIG. 2). This window 38 is defined by the edges 40'A and 40'B in the displacement direction of the shutters 16'A and 16'B by the edges 40'C of the second shutter 16'B in the transverse direction or by the support means 32, or by any other element of the device. The second shutter 16'B has an opening 42' of dimensions comparable to those of the face 22 of the panel 20 to be exposed, such that when the first shutter 16'A is fully open, the entire face 22 can be exposed in a single exposure time.

Thus, depending on the type of photosensitive material on the face 22 for exposure, the first shutter 16'A is opened fully or in part only so as to reveal a window 38 enabling a light zone 38' to be generated on the face 22 which, by virtue of the displacement of the second shutter 16'B, will scan over the entire surface. Whatever the type of exposure that is selected, the first shutter 16'A is initially opened to an appropriate spacing L relative to the second shutter 16'B at a speed V, e.g. to the right in FIG. 4 as shown by direction D1.

After an exposure time that is preferably about 2 seconds for overall exposure, or as soon as the window 38 has opened for exposure by scanning, the second shutter 16'B is moved at the same speed V and in the same direction D1 as the first shutter 16'A, i.e. to the right, taking with it the first shutter 16'A. The left-hand portion of the second shutter 16'B thus moves progressively to mask the zone 38' which has been exposed as the window 38 travels in the direction D1 past the face 22.

In order to interrupt exposure, the second shutter 16'B closes the light box assembly 10 (as shown in FIGS. 1 and 2). The following exposure is then performed from right to left, in the opposite direction D2, and so on.

Away from the exposure zone, on one side thereof, the first shutter 16'A is preferably opened prior to first exposure so that the second shutter 16'B is used for closing the light box assembly 10. Under such circumstances, the speed of the first shutter 16'A for opening the window 38 can be a speed V' different from the scanning speed V of the window 38 which is driven by both shutters 16'A and 16'B.

When the window 38 is opened outside the exposure zone, i.e. away from the range of the light source 26, e.g. on one of the sides of the device, the window 38 can be preset to a particular size before each exposure.

In addition, when the window can be moved away from the exposure zone after each exposure of a panel 22, the window 38 can be left open throughout the duration of an exposure cycle for exposing an entire series of panels 22. Preadjustment need then be performed only when changing the power of the light source 26 or the type of photosensitive material.

When the size of the window 38 is preset away from the exposure zone, the displacement speed V' of the first shutter 16'A over the second 16'B may tend towards zero, and the first shutter 16'A may be displaced manually to the desired distance L.

This preadjustment of the window 38 serves to reduce the total time required for exposing a series of panels 22. This time is reduced all the more when the size of the window 38 is preadjusted in parallel with some other operation, e.g. while the first panel 22 for exposure is being put into place or while the light source 26 is being changed.

Figure 5:
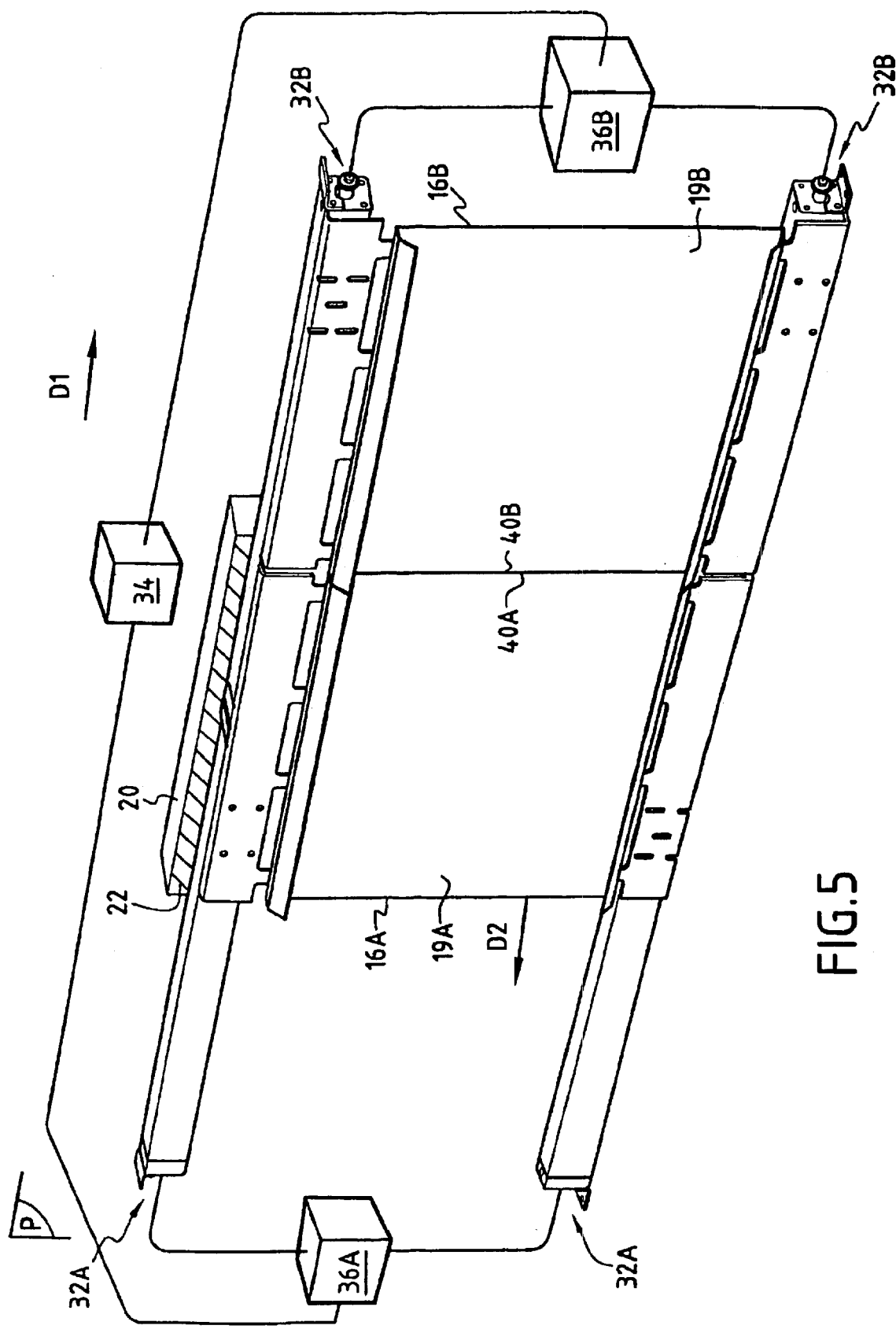
FIG. 5 is a perspective view of the shutters in another embodiment, the two shutters touching each other.
Figure 6:
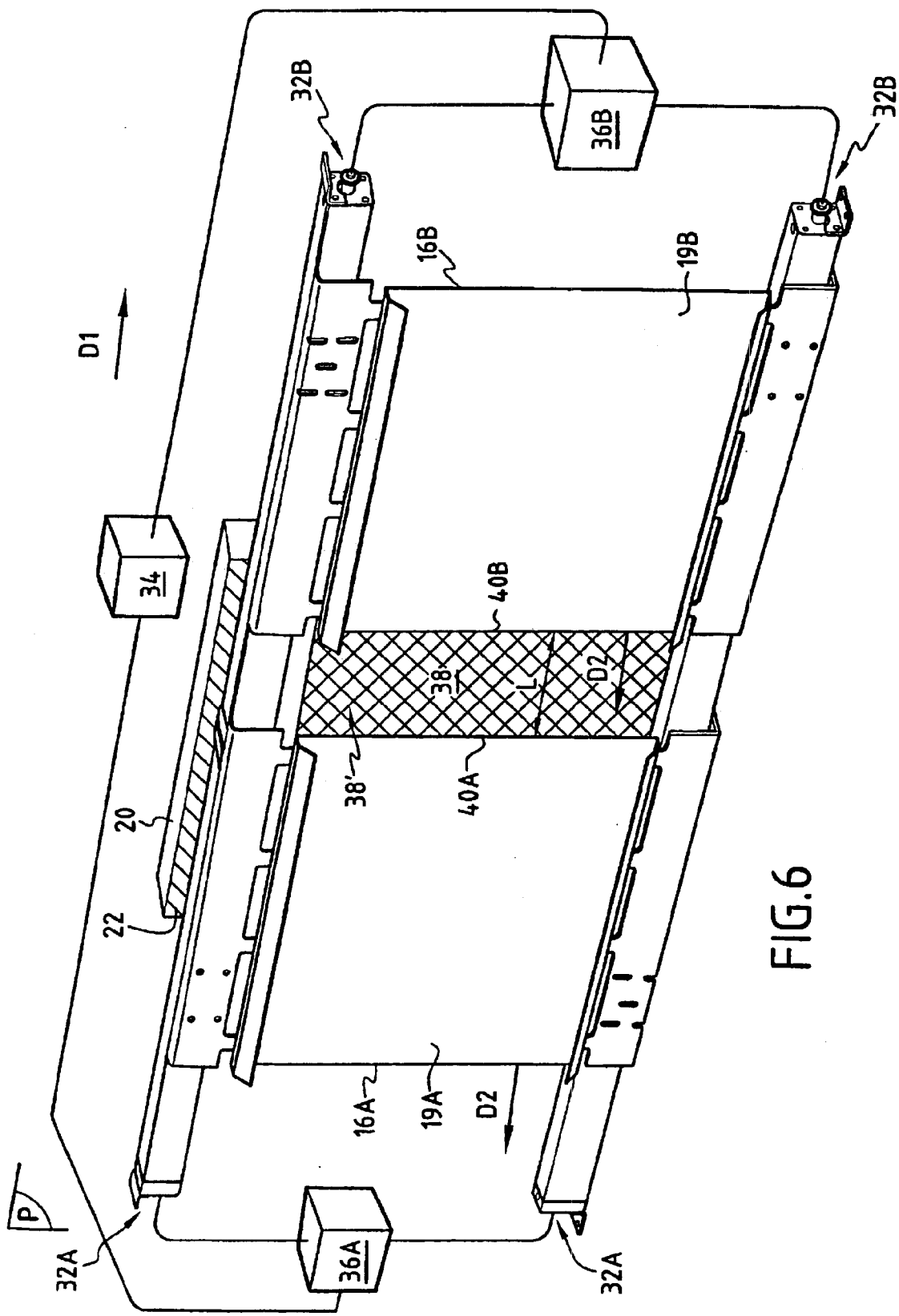
FIG. 6 is a view analogous to FIG. 4, but showing the two shutters spaced apart.

In a second embodiment shown in FIGS. 5 and 6, each of the shutters 16A and 16B slides individually past the light box assembly 10. In this embodiment, both shutters 16A and 16B are identical and each of them necessarily moves at the same speed V past the light source 26 (see FIG. 2). This embodiment is comparable with the preceding embodiment and differs only in the relative displacement of the shutters 16A and 16B and in the displacement means. The shutters 16A and 16B have the same properties of withstanding the heat to be removed, having a strength member of refractory material (not shown) and with heat being removed via a respective side 19A, 19B coated in light reflecting material.

Thus, starting from the closed position shown in FIG. 5 in which, by way of example, the first shutter 16A closes the entire light box 10 while the second shutter 16B is on the right-hand side of the device, the two respective edges 40A and 40B of the shutters are touching.

Each of the shutters 16A, 16B is fixed to a pair of rodless pneumatic actuators 32A, 32B disposed on opposite sides of the shutter 16A, 16B so as to ensure that each of the shutters 16A, 16B is properly guided. Each pair of rodless pneumatic actuators 32A, 32B is controlled by the displacement control means 34 via first and second initialization means 36A and 36B specific to each pair of rodless pneumatic actuators 32A, 32B.

By way of example, for scanning type exposure, the window 38 is partially opened by the first initialization means 36A for the first shutter 16A activating it to travel to the left at the speed V, i.e. in direction D2, as shown in FIG. 6, while keeping the second shutter 16B stationary.

As soon as the window 38 has opened to the desired size, i.e. once the first shutter has traveled so that the distance L exists between the two edges 40A and 40B, the second shutter 16B is caused to be displaced by the second initialization means 36B and starts following the first shutter 16A at the same speed V and in the same direction D2. The window 38 of fixed size corresponding to the spacing between the two shutters 16A and 16B both moving at the same speed V thus itself moves in the direction D2 past the light box assembly 10 (shown in FIGS. 1 and 2) and past the face 22 that is to be exposed at said speed V.

At the end of the stroke, which is generally about 50 cm long, the window 38 is closed by moving the edge 40B of the second shutter 16B up to the edge 40A of the first shutter 16A which is then stationary.

The following exposure is performed by moving the shutters 16A and 16B in the same manner as that described but so that they come back towards the right, i.e. in direction D1, and so on.

In order to expose the entire face 22, after the window 38 has been opened to its maximum size by displacing the first shutter 16A to the left in direction D2 at speed V, an exposure time that is preferably about 2 seconds is allowed to elapse during which both shutters 16A and 16B are stationary. Once this time has elapsed, the second shutter 16B begins moving to the left, still in direction D2 and at speed V until the window 38 is reclosed when the edge 40B comes into contact with the edge 40A, and so on.

Whatever the type of exposure that is performed, a scanning exposure by moving the window 38 or a global exposure by opening the window 38 to the full, the window can be kept open at the end of exposing the face 22. To do this, it suffices to displace the window 38 beyond the exposure zone, i.e. alternately on the left-hand side and on the right-hand side of the device.

The technique of exposing the face 22 by scanning, i.e. of displacing the window 38, is particularly recommended when exposure times are shorter than 1 second, whereas global exposure is better suited to exposure times that may be as long as several seconds.

The object of the present invention is to make it possible to expose all of the face 22 either by scanning or by global exposure, but it will naturally be understood that the device can also be used to expose defined zones on the face 22, e.g. a strip or some other more complex shape. For this purpose, it would suffice to provide shutters or windows that move in other directions, for example, or to provide shutters of more complex shapes, for example.

What is claimed is:

1. A device for exposing by scanning at least one face of a panel, in particular a printed circuit panel, said face having a sensitivity, the device comprising a light source having a power and support means for supporting fixedly said panel facing said light source, the device further comprising:

first and second moving shutters suitable for acting in succession to mask said light source at least in part, each of said shutters presenting a respective edge, said edges together defining a window of a size suitable for being adjusted and through which a light zone is generated for scanning said face of the panel to be exposed;

displacement means for displacing said shutters to displace said shutters in a plane disposed between said light source and said panel, first for opening said window and adjusting said window's size by displacing said first moving shutter in front of said face of the panel to be exposed, second for displacing said adjusted window by displacing simultaneously said first and second moving shutters so that said light zone scans said face of the panel to be exposed, and third for closing said window by displacing said second moving shutter in front of said face of the panel at an end of an exposition; and displacement control means for controlling the displacement of said shutters as a function of said sensitivity of the face to be exposed and as a function of said power of said light source, in such a manner that both shutters move past said face of the fixed panel at substantially the same speed and in the same direction.

2. The device according to claim 1, wherein said displacement means comprise a first displacement means for said first shutter and a second displacement means for said second shutter.

3. The device according to claim 1, wherein said displacement means comprise an actuator.

4. The device according to claim 1, wherein said displacement control means include first displacement initialization means for initializing displacement of said first shutter and second displacement initialization means for initializing displacement of said second shutter, said first and second displacement initialization means being independent of each other and enabling the size of said window to be adjusted.

5. The device according to claim 2, wherein said first displacement means are disposed on said second shutter such that said first shutter is suitable for moving relative to said second shutter.

6. The device according to claim 1, wherein said device further includes a cooling device for cooling said light source.

7. The device according to claim 1, wherein each shutter includes refractory material.

8. The device according to claim 1, wherein each shutter presents a reflecting surface enabling it to reflect at least a fraction of the light emitted by the light source.

9. A device for exposing at least one face of a panel, in particular a printed circuit panel, said face having a sensitivity, the device comprising a light source having a power and support means fixedly supporting said panel facing said light source, the device further comprising:

first and second moving shutters suitable for acting in succession to mask said light source at least in part, each of said shutters presenting a respective edge, said edges together defining a window of a size suitable for being adjusted and through which a light zone is generated for scanning said face of the panel to be exposed;

displacement means for displacing said shutters in a plane disposed between said light source and said panel for, firstly, opening said window and adjusting said window's size by displacing said first moving shutter in front of said face of the panel to be exposed, for, secondly, exposing said face of the panel, and for, thirdly, closing said window by displacing said second moving shutter in front of said face of the panel at the end of the exposition; and displacement control means for controlling the displacement of said shutters as a function of said sensitivity of the face to be exposed and as a function of said power of said light source, in such a manner that both shutters move past said face of the fixed panel at substantially the same speed and in the same direction.

10. The device according to claim 9, wherein said displacement means comprise a first displacement means for said first shutter and a second displacement means for said second shutter.

11. The device according to claim 9, wherein said displacement control means include first displacement initialization means for initializing displacement of said first shutter and second displacement initialization means for initializing displacement of said second shutter, said first and second displacement initialization means being independent of each other and enabling the size of said window to be adjusted.

12. The device according to claim 10, wherein said first displacement means are disposed on said second shutter such that said first shutter is suitable for moving relative to said second shutter.

13. The device according to claim 9, wherein said device further includes a cooling device for cooling said light source.

14. A device for exposing by scanning at least one face of a panel, in particular a printed circuit panel, said face having a sensitivity, the device comprising a light source having a power and support means for supporting fixedly said panel facing said light source, the device further comprising:

first and second moving shutters suitable for acting in succession to mask said light source at least in part, each of said shutters presenting a respective edge, said edges together defining a window of a size suitable for being adjusted and through which a light zone is generated for scanning said face of the panel to be exposed;

displacement means for displacing said shutters to displace said shutters in a plane disposed between said light source and said panel for opening said window and adjusting said window's size by displacing said first moving shutter outside an exposure zone prior to the displacement of said second moving shutter, for displacing said adjusted window by displacing simultaneously said first and second moving shutters so that said light zone scans said face of the panel to be exposed, and for closing said window by displacing said second moving shutter outside said exposure zone; and displacement control means for controlling the displacement of said shutters as a function of said sensitivity of the face to be exposed and as a function of said power of said light source, in such a manner that both shutters move past said face of the fixed Panel at substantially the same Speed and in the same direction.

15. The device according to claim 14, wherein said displacement means comprise a first displacement means for said first shutter and a second displacement means for said second shutter.

16. The device according to claim 14, wherein said displacement control means include first displacement initialization means for initializing displacement of said first shutter and second displacement initialization means for initializing displacement of said second shutter, said first and second displacement initialization means being independent of each other and enabling the size of said window to be adjusted.

17. The device according to claim 15, wherein said first displacement means are disposed on said second shutter such that said first shutter is suitable for moving relative to said second shutter.

18. A device for exposing at least one face of a panel, in particular a printed circuit panel, said face having a sensitivity, the device comprising a light source having a power and support means for supporting fixedly said panel facing said light source, the device further comprising:

first and second moving shutters suitable for acting in succession to mask said light source at least in part, each of said shutters presenting a respective edge, said edges together defining a window of a size suitable for being adjusted and through which a light zone is generated for scanning said face of the panel to be exposed;

displacement means for displacing said shutters to displace said shutters in a plane disposed between said light source and said panel for opening said window and adjusting said window's size by displacing said first moving shutter outside an exposure zone prior to the displacement of said second moving shutter, for exposing said face of the panel to be exposed, and for closing said window in displacing said second moving shutter outside said exposure zone; and displacement control means for controlling the displacement of said shutters as a function of said sensitivity of the face to be exposed and as a function of said power of said light source, in such a manner that both shutters move past said face of the fixed panel at substantially the same speed and in the same direction.

19. The device according to claim 18, wherein said displacement means comprise a first displacement means for said first shutter and a second displacement means for said second shutter.

20. The device according to claim 18, wherein said displacement control means include first displacement initialization means for initializing displacement of said first shutter and second displacement initialization means for initializing displacement of said second shutter, said first and second displacement initialization means being independent of each other and enabling the size of said window to be adjusted.

* * * * *